United States Patent
Tang

(10) Patent No.: US 8,293,588 B2
(45) Date of Patent: Oct. 23, 2012

(54) METHOD OF PROVIDING AN ELECTRONIC DEVICE INCLUDING DIES, A DIELECTRIC LAYER, AND AN ENCAPSULATING LAYER

(75) Inventor: Jinbang Tang, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/151,778

(22) Filed: Jun. 2, 2011

(65) Prior Publication Data

US 2011/0230014 A1 Sep. 22, 2011

Related U.S. Application Data

(62) Division of application No. 12/398,603, filed on Mar. 5, 2009, now Pat. No. 7,977,785.

(51) Int. Cl.
*H01L 21/56* (2006.01)
*H01L 21/58* (2006.01)

(52) U.S. Cl. . 438/124; 438/126; 438/112; 257/E23.169; 257/E23.124

(58) Field of Classification Search .................. 438/124, 438/126, 112; 257/E23.169, E23.124, 728
See application file for complete search history.

(56) References Cited

U.S. PATENT DOCUMENTS

| 5,206,712 A * | 4/1993 | Kornrumpf et al. | .......... 361/729 |
| 5,353,195 A * | 10/1994 | Fillion et al. | .................. 361/760 |
| 5,985,736 A | 11/1999 | Orlowski et al. | |
| 6,873,044 B2 | 3/2005 | Ammar | |
| 7,294,529 B2 | 11/2007 | Tuominen | |
| 2003/0122250 A1 | 7/2003 | Matsuta | |
| 2006/0131736 A1 | 6/2006 | Jansman et al. | |
| 2008/0266829 A1 | 10/2008 | Tang et al. | |

OTHER PUBLICATIONS

Rogers Corporation, RO4000 Series High Frequency Circuit Materials (Woven Glass Reinforced, Ceramic Filled Thermoset), <<http://www.rogerscorp.com>>, Jan. 17, 2009, 4 pages.

* cited by examiner

*Primary Examiner* — Matthew W Such
*Assistant Examiner* — Scott Stowe

(57) ABSTRACT

A method of packaging an electronic device includes providing a patterned dielectric layer with an area sized to receive a first die, and another area sized to receive a second die, placing the first and second dies within the first and second areas, encapsulating the dies with an encapsulating material that has a different composition from the dielectric layer, forming a first signal line between the dies, forming a second signal line to the first die, and forming an additional signal line to the first die. The dielectric layer is disposed between the first signal line and the encapsulating material, the electronic device transmits a signal in an approximate range of 1 GHz to 100 GHz along the second signal line, and a signal that does not exceed approximately 900 MHz along the additional signal line.

20 Claims, 7 Drawing Sheets

METHOD OF PROVIDING AN ELECTRONIC DEVICE INCLUDING DIES, A DIELECTRIC LAYER, AND AN ENCAPSULATING LAYER

CROSS-REFERENCE TO RELATED APPLICATIONS

This is a divisional application of and claims priority under 35 U.S.C. §120 to U.S. patent application Ser. No. 12/398,603 originally entitled "Electronic Device and Method of Packaging an Electronic Device," and amended to be entitled "Method of Providing an Electronic Device Including Dies, a Dielectric Layer, and an Encapsulating Layer," by Jinbang Tang, filed Mar. 5, 2009, which is assigned to the current assignee hereof and incorporated herein by reference in its entirety.

FIELD OF THE DISCLOSURE

The present disclosure generally relates to electronic devices and methods of packaging electronic devices.

BACKGROUND

Semiconductor chips and other dies are packaged in housings that can be coupled to a printed circuit board. Packaging can be accomplished using particular technologies, such as wire bonding, flip chip packaging or chip first packaging. Often, many dies are packaged simultaneously to produce a packaging panel. The packaging panel is divided, or singulated, into individual devices that each contain a die.

BRIEF DESCRIPTION OF THE DRAWINGS

It will be appreciated that for simplicity and clarity of illustration, elements illustrated in the Figures have not necessarily been drawn to scale. For example, the dimensions, angles and curvatures of some of the elements may be exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF THE DRAWINGS

The numerous innovative teachings of the present application will be described with particular reference to the presently preferred exemplary embodiments. However, it should be understood that this class of embodiments provides only a few examples of the many advantageous uses of the innovative teachings herein. In general, statements made in the specification of the present application do not necessarily limit any of the various claimed inventions. Moreover, some statements may apply to some inventive features but not to others.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single device is described herein, more than one device may be used in place of a single device. Similarly, where more than one device is described herein, a single device may be substituted for that one device.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. In addition, the materials, methods, and examples are illustrative only and not intended to be limiting.

Figure 1:
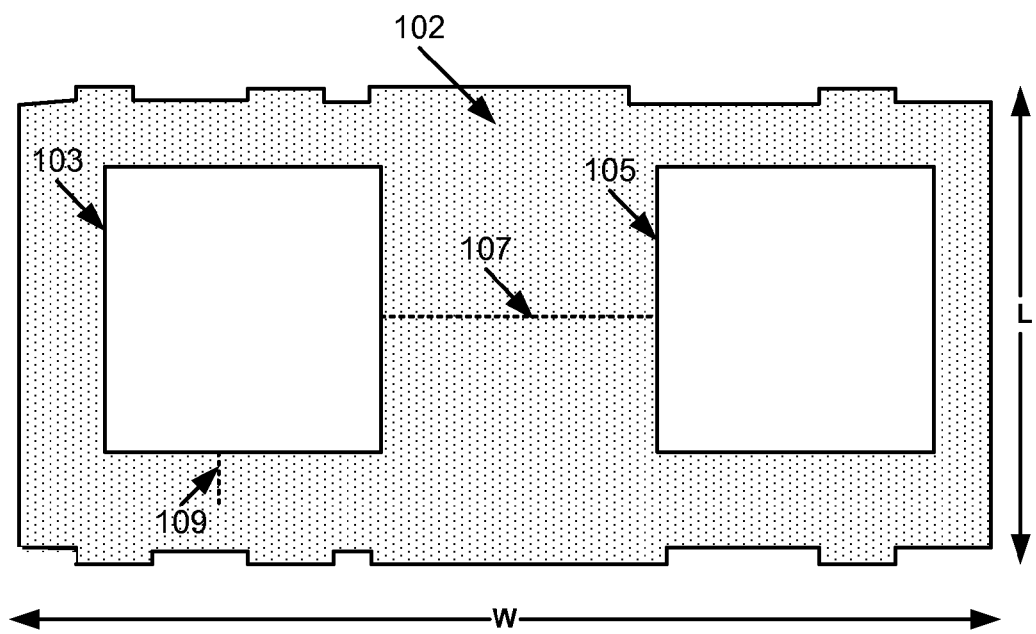
FIGS. 1 and 2 are diagrams illustrating a particular embodiment of an electronic device including a dielectric layer.
Figure 2:
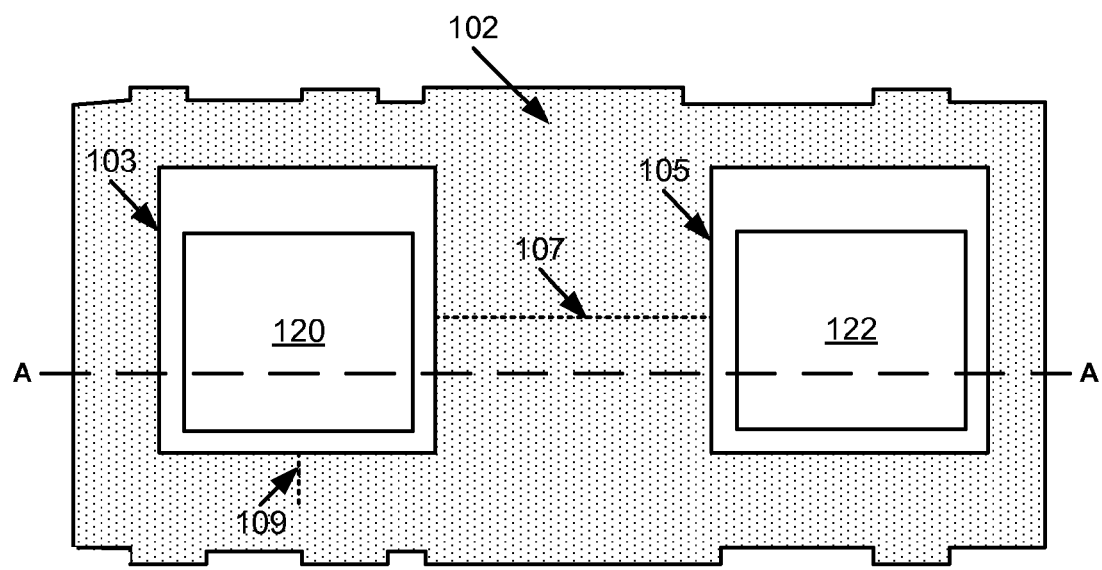

FIGS. 1 and 2 illustrate a particular embodiment of an electronic device, such as a bottom view of the electronic device before an encapsulating material is formed thereon. The electronic device includes a dielectric layer 102 having a width, W, and a length, L. In some embodiments, the dielectric layer 102 can be included in a packaging panel, such as in the form of a dielectric plate. The dielectric layer 102 includes an opening 103 sized to receive a die, such as the die 120. The dielectric layer 102 can also include another opening 105 sized to receive another die, such as the die 122. In an illustrative embodiment, the dielectric layer 102 can include a pre-patterned portion 107 for formation of a signal line. In another illustrative embodiment, the dielectric layer 102 can include another pre-patterned portion 109 for formation of another signal line. In another embodiment (not illustrated), the dielectric layer 102 does not include the pre-patterned portions 107 and 109, or other pre-patterned portions other than openings 103 and 105. Those skilled in the art will recognize that the dielectric layer 102 can include an additional opening sized to receive an additional die; an additional pre-patterned portion for formation of an additional signal line; or any combination thereof.

In a particular embodiment, the dielectric layer 102 can include an organic material, a ceramic material, or any combination thereof. For example, the dielectric layer 102 can include a composite of organic material and ceramic material, such as a hydrocarbon ceramic material or a polytetrafluoroethylene (PTFE) ceramic material. In an illustrative, non-limiting embodiment, the dielectric layer 102 can include Rogers RO3000 series materials, such as RO03003™-RO3210™ materials; Rogers RO4000 series materials, such as RO4003™-RO4450™ materials; or any combination thereof (Rogers Corporation; Rogers, Conn.).

Figure 3:
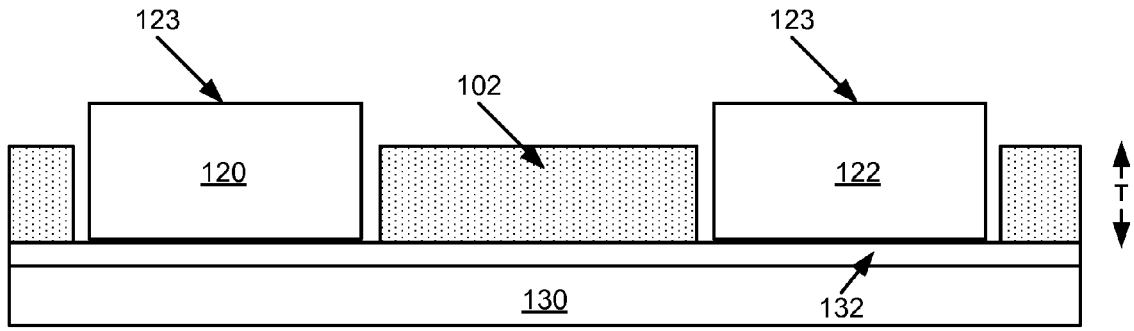
FIG. 3 is a diagram illustrating a cross-sectional view of the electronic device illustrated in FIG. 2.

FIG. 3 illustrates a cross-sectional view of the electronic device illustrated in FIG. 2, taken along the line A-A. As illustrated, the dies 120 and 122 can be held upside down on a process carrier 130, such that a non-active portion 123 of each die is exposed (e.g., facing up). In one embodiment, the dies 120 and 122 can be held in position on the process carrier 130 by means of double-sided tape or other removable adhesive layer 132.

In an illustrative embodiment, the dielectric layer 102 can have a thickness, T, of from approximately 30 µm to approximately 250 µm, such as from approximately 50 µm to approximately 100 µm. The dielectric layer 102 has a dielectric constant within fifty percent of a dielectric constant of the encapsulating material 104. For instance, the dielectric layer 102 has a dielectric constant within ten percent of a dielectric constant of the encapsulating material 104. In one embodiment, dielectric constant of the dielectric layer 102 can be from approximately 2.7 to approximately 3.9, such as from approximately 3.0 to approximately 3.6.

Figure 4:
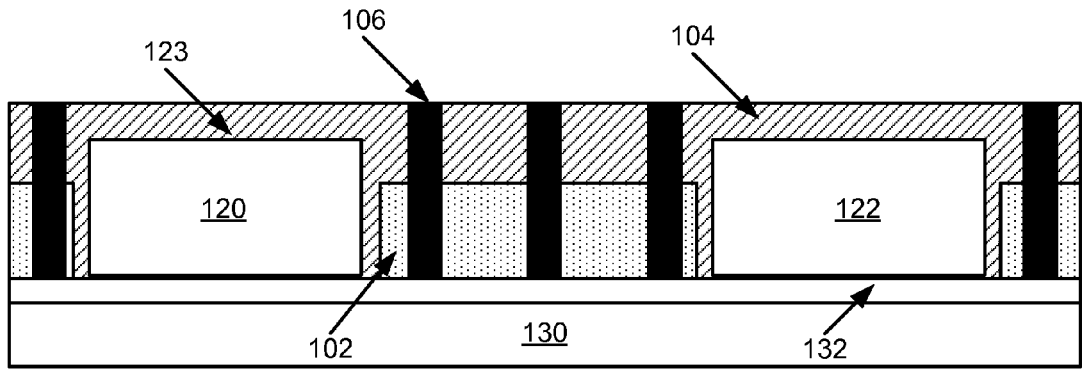
FIG. 4 is a diagram illustrating the electronic device illustrated in FIGS. 2-3 including an encapsulating material.
Figure 5:
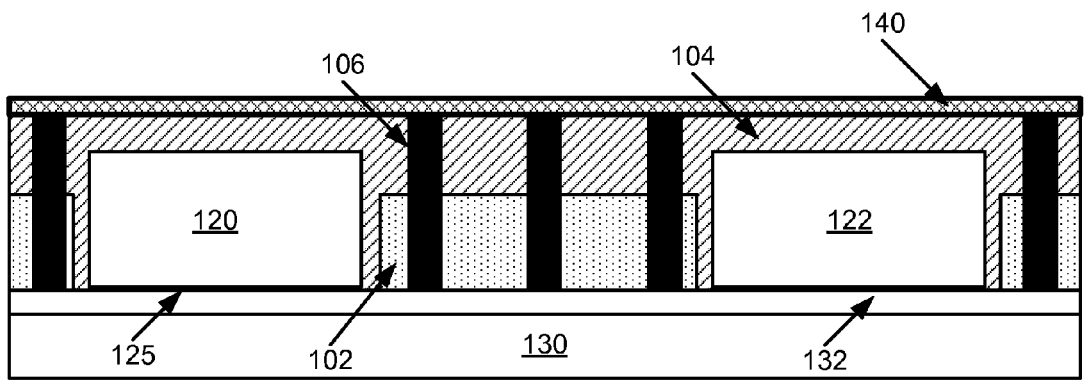
FIG. 5 is a diagram illustrating the electronic device illustrated in FIG. 4 including a conductive layer.
Figure 6:
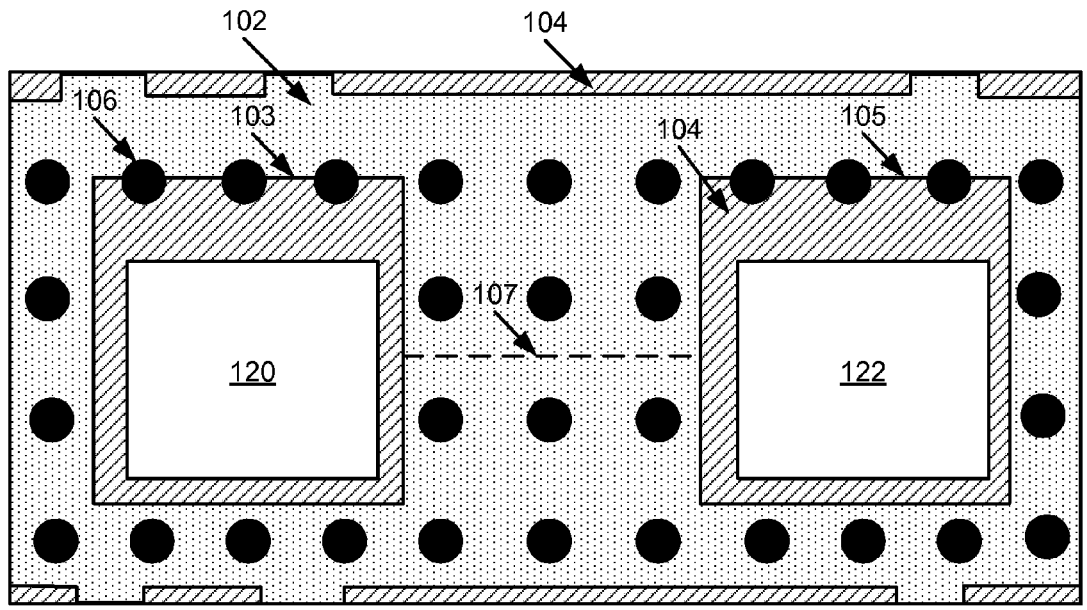
FIG. 6 is a diagram illustrating a top view of the electronic device illustrated in FIG. 5 after removal of the adhesive layer and process carrier.

FIGS. 4-6 illustrate the electronic device illustrated in FIG. 3, after formation of an encapsulating material 104. The encapsulating material 104 is adjacent to the die 120, the die 122, another die, or any combination thereof. For instance, the encapsulating material 104 can substantially encapsulate the die 120, the die 122, another die, or any combination thereof. Further, the encapsulating material 104 can be disposed in a gap between the dielectric layer 102 and a die, such as the die 120. In one embodiment, as further illustrated in FIG. 4, the encapsulating material 104 can form a substantially continuous molding layer that overlays the non-active portion 123 of each die 120 and 122. The molding layer can be polished or otherwise planarized.

The encapsulating material 104 may have a different composition as compared to the dielectric layer 102. Alternatively, the encapsulating material 104 may have a substantially same composition as compared to the dielectric layer 102. In one embodiment, the encapsulating material 104 can include an organic material, such as an epoxy. Further, the encapsulating material 104 can include an inorganic filler material, such as talc, silica, alumina, another inorganic filler, or any combination thereof.

In a particular embodiment, the electronic device also includes an electrically conductive carrier, such as a thru via 106, that extends through both the dielectric layer 102 and the encapsulating material 104. The electrically conductive carrier can have a length that is substantially perpendicular to a width of the dielectric layer 102, such as the width, W, illustrated in FIG. 1. The electrically conductive carrier is adapted to electrically ground the electronic device; to at least partially shield a die from electromagnetic interference, such as the die 120, the die 122, another die, or any combination of dies; or to do any combination thereof.

In one embodiment, the electronic device can include a plurality of thru vias 106. The thru vias 106 can be formed via chemical etching, laser drilling, another suitable method, or any combination thereof. The thru vias 106 are filled with a conductive material that can include copper, aluminum, tungsten, gold, silver, a conductive polymer, another suitable conductive material, or any combination thereof. In one embodiment, a thru via 106 can be filled via a deposition process and the conductive material can be polished or otherwise planarized substantially even with an opening of the thru via 106. Some of the thru vias 106 can extend to a surface of the encapsulating material 104 that is opposite an active portion 125 of the die 120. As illustrated in FIG. 5, some of the thru vias 106 can be electrically connected with each other through contact with an electrically conductive layer 140 that is formed after the thru vias 106 are formed and filled. The encapsulating material 104 is disposed between the electrically conductive layer 140 and the dielectric layer 102.

FIG. 6 illustrates a top view of the electronic device illustrated in FIG. 5, after the process carrier 130 and the adhesive layer 132 have been removed and the electronic device 100 has been inverted to expose the active portion 125 of the dies 120 and 122. Further, as illustrated in FIG. 6, some of the thru vias 106 can be disposed between the die 120 and the die 122.

Figure 7:
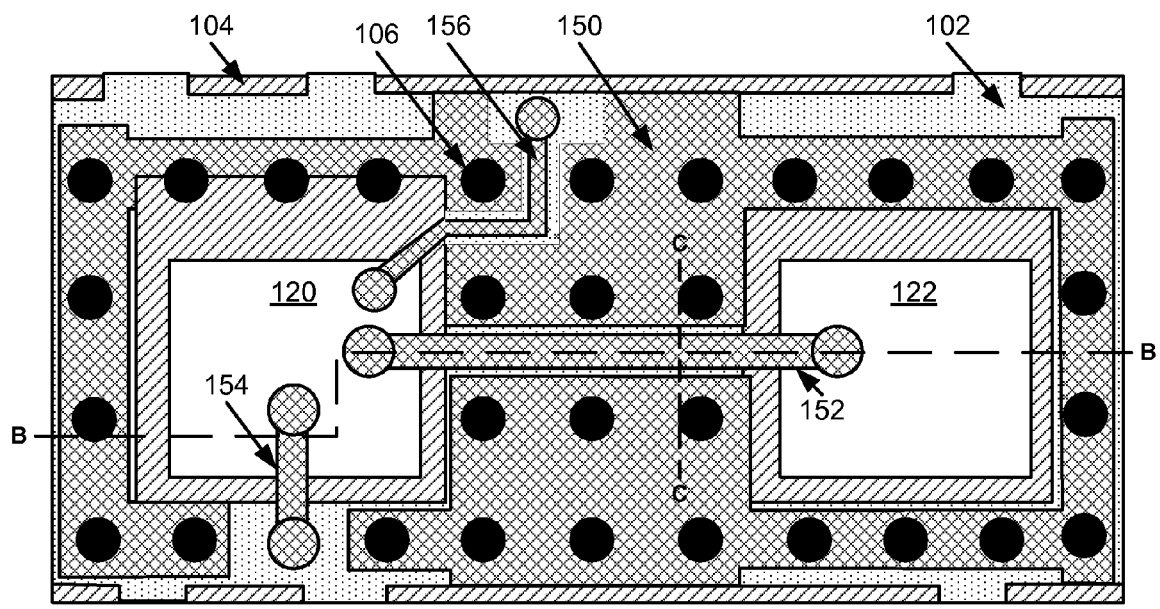
FIG. 7 is a diagram illustrating the electronic device illustrated in FIG. 6 including another conductive layer and a signal line.
Figure 8:
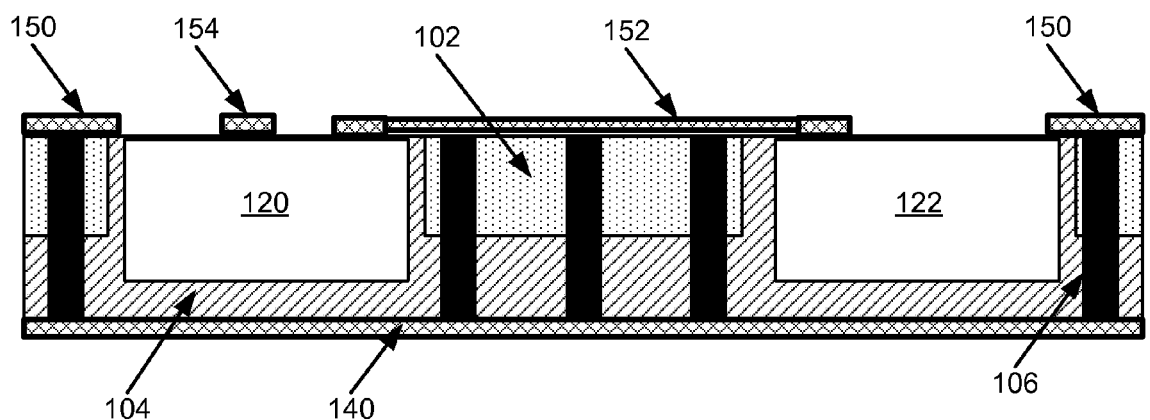
FIG. 8 is a cross-sectional view of the electronic device illustrated in FIG. 7.

FIG. 7 illustrates a top view of the electronic device 100 illustrated in FIG. 6, after formation of another electrically conductive layer 150. FIG. 8 illustrates a cross-sectional view of the electronic device illustrated in FIG. 7, taken along the line B-B. The dielectric layer 102 is disposed between the electrically conductive layer 150 and the encapsulating material 104. In a particular embodiment, some of the thru vias 106 can be electrically connected through contact with the electrically conductive layer 150.

The electrically conductive layer 150 includes a signal line 152 coupled to the die 120 and the die 122. The signal line 152 is not electrically connected to any of the thru vias 106. In an illustrative embodiment, the electronic device 100 can be operable to transmit an electrical signal having a frequency of up to approximately 100 GHz along the signal line 152, such as within a range of from approximately 1 GHz to approximately 90 GHz.

The conductive layer 150 can also include another signal line 154 coupled to a die, such as the die 120, and to an I/O pad or a thru via 106 to be connected to the opposite side. In a particular embodiment, the signal line 152 and the other signal line 154 can lie at a same elevation on the electronic device. The electronic device 100 can be operable to transmit another electrical signal having a frequency up to 100 GHz, such as within a range of from approximately 1 GHz to approximately 90 GHz, along the other signal line 154.

In a particular embodiment, the conductive layer 150 can also include an additional signal line 156 coupled to a die, such as the die 120, and to an I/O pad. The additional signal line 156 can be disposed in between thru vias 106 via patterned metallization. The additional signal line 156 can lie at a same elevation as the signal lines 152 and 154, or at a different elevation. In one example, the electronic device can be operable to transmit non-critical signals, such as electrical signals having a frequency not to exceed approximately 1 GHz, such as signals having a frequency not to exceed 900 MHz, via the additional signal line 156.

Figure 9:
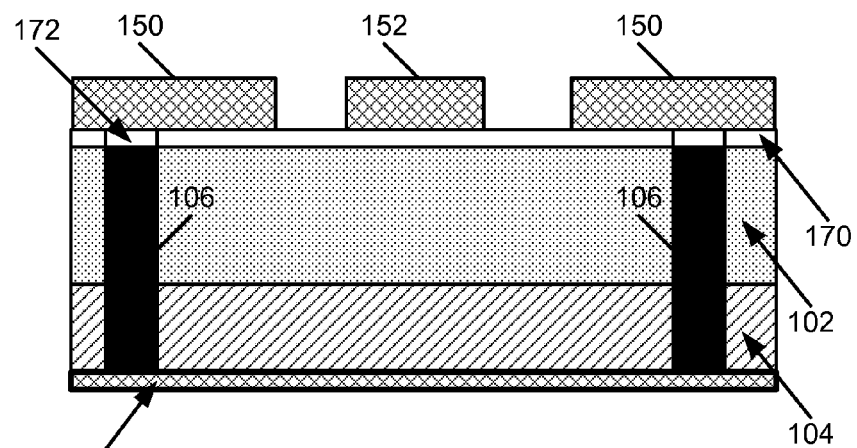
FIG. 9 is another cross-sectional view of the electronic device illustrated in FIG. 7.

FIG. 9 illustrates a cross-sectional view of the electronic device illustrated in FIG. 7, taken along the line C-C. In a particular embodiment, the electronic device can include an insulating layer 170 disposed between the electrically conductive layer 150 and the dielectric layer 102. Electrically conductive microvias 172 can electrically connect the thru vias 106 with the electrically conductive layer 150. Those skilled in the art will recognize that additional processing steps can be performed in building the electronic device. For instance, additional conductive layers, insulating layers (e.g., an insulating layer formed along the top of the conductive layer 150), or any combination thereof, can be formed as needed for a specific application of the electronic device.

Figure 10:
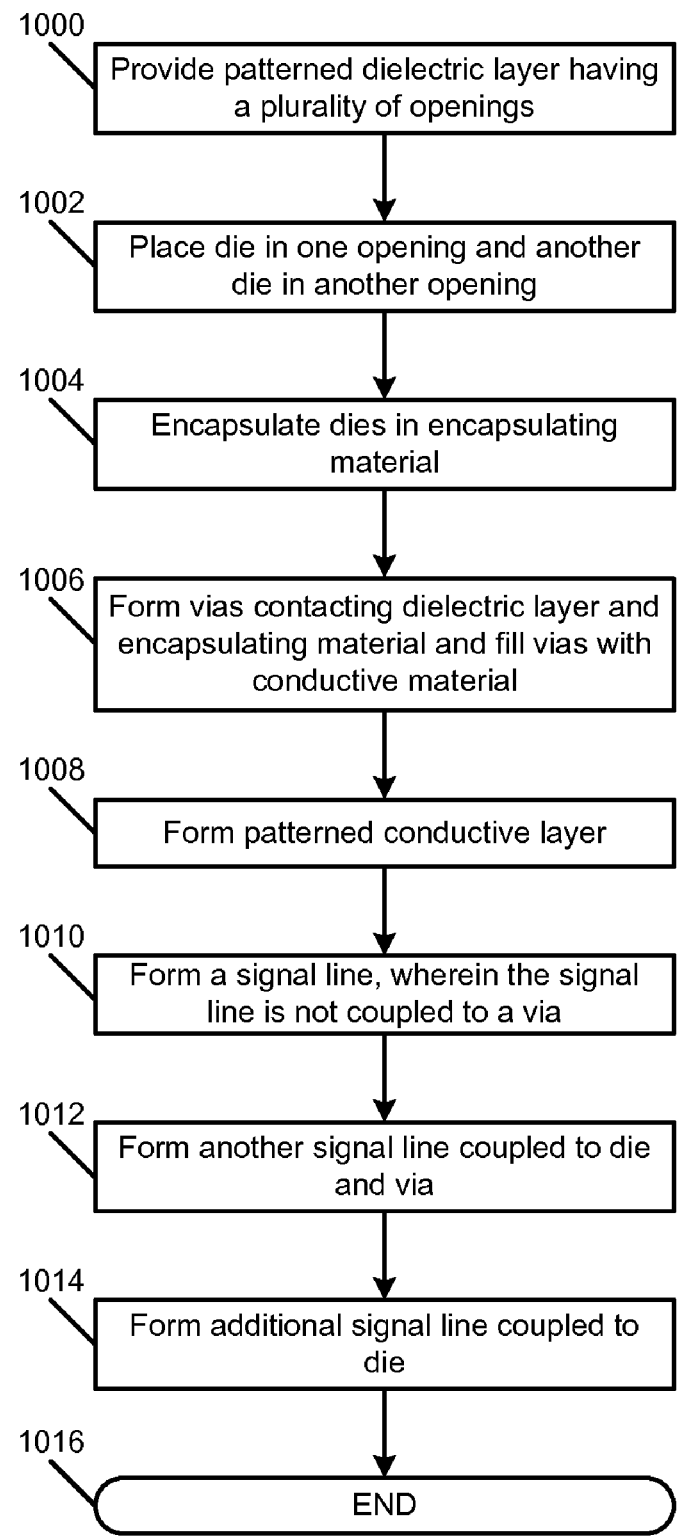
FIG. 10 is a flow diagram illustrating a method of packaging an electronic device.

FIG. 10 illustrates a particular embodiment of a method of packaging an electronic device. At block 1000, a patterned dielectric layer is provided having a plurality of openings. Moving to block 1002, a die is placed in one of the openings, and another die is placed in another of the openings. Proceeding to block 1004, the dies are encapsulated in an encapsulating material.

Continuing to block 1006, a plurality of thru vias are formed extending through the dielectric layer and the encapsulating material. For instance, the thru vias can be formed by laser drilling or chemically etching the thru vias through the dielectric layer and the encapsulating material at substantially ninety degrees relative to a width of the dielectric layer. The thru vias are filled with a conductive material. Advancing to block 1008, a patterned conductive layer is formed, where the dielectric layer is disposed between the patterned conductive layer and the encapsulating material. Some of the thru vias can be coupled to the patterned conductive layer, thereby grounding the electronic device, at least partially shielding a die from electromagnetic interference, or any combination thereof.

At block 1010, a signal line is formed that is not electrically connected to any of the thru vias. The electronic device can be operable to transmit a signal having a frequency of up to approximately 100 GHz along the signal line, such as a frequency within a range of from approximately 1 GHz to approximately 90 GHz. Moving to block 1012, in a particular embodiment, another signal line can be formed that is coupled to a die and to an I/O pad or a thru via. The electronic device can be operable to transmit a signal having a frequency that is up to approximately 100 GHz via the signal line, such as a frequency within a range of from approximately 1 GHz to approximately 90 GHz. Proceeding to block 1014, an additional signal line is formed. The electronic device can be operable to transmit a signal having a frequency not to exceed approximately 1 GHz, such as signals having a frequency not to exceed 900 MHz via the additional signal line. The method terminates at 1016.

In some embodiments, the method disclosed herein can be performed substantially as described. In other embodiments, aspects of the method can be performed in alternative sequences or simultaneously. For instance, the signal lines can be formed substantially simultaneously as a patterned metallization layer is formed.

In accordance with the embodiments disclosed herein, an electronic device is provided that includes a dielectric layer defining an opening and a die disposed within the opening. The electronic device also includes an encapsulating material disposed adjacent the die. The electronic device has a different composition than the dielectric layer. In a particular embodiment, the electronic device includes an electrically conductive carrier, such as a via, contacting the dielectric layer and the encapsulating material.

The dielectric layer provides a low loss environment for high-frequency signals, such as radar signals and other signals in the millimeter wavelength range. In addition, a plurality of vias can be disposed between dies of an electronic device to at least partially shield a die from electromagnetic interference, to ground the electronic device, or any combination thereof.

Figure 11:
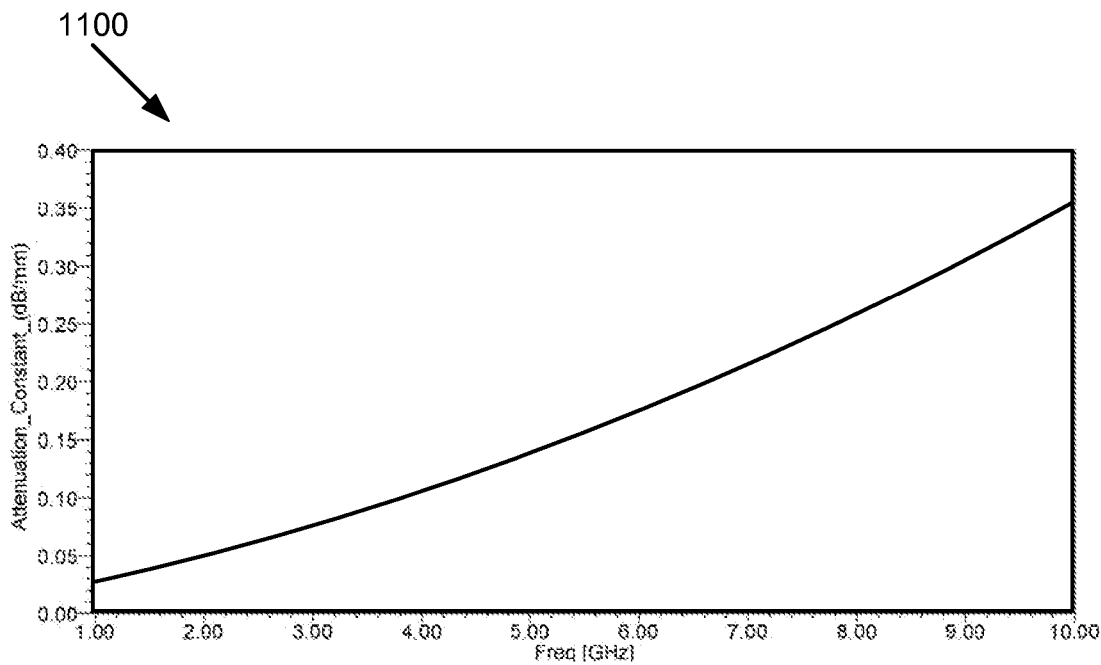
FIG. 11 is a graph illustrating variations in attenuation constant related to electrical signals of particular frequencies transmitted by an electronic device having an embedded grounding plane.

In one example, the attenuation constant of the electronic device can be reduced for signals of particular frequencies transmitted by the electronic device, as compared to an electronic device using an embedded grounding plane. For instance, FIG. 11 includes a graph 1100 that illustrates changes in attenuation constant for a conventional electronic device using an embedded grounding plane, for signals having frequencies from approximately 1 GHz to approximately 10 GHz at approximately 50 ohms. The attenuation constant for this electronic device varies from approximately 0.02 dB/mm to approximately 0.35 dB/mm over these frequencies.

Figure 12:
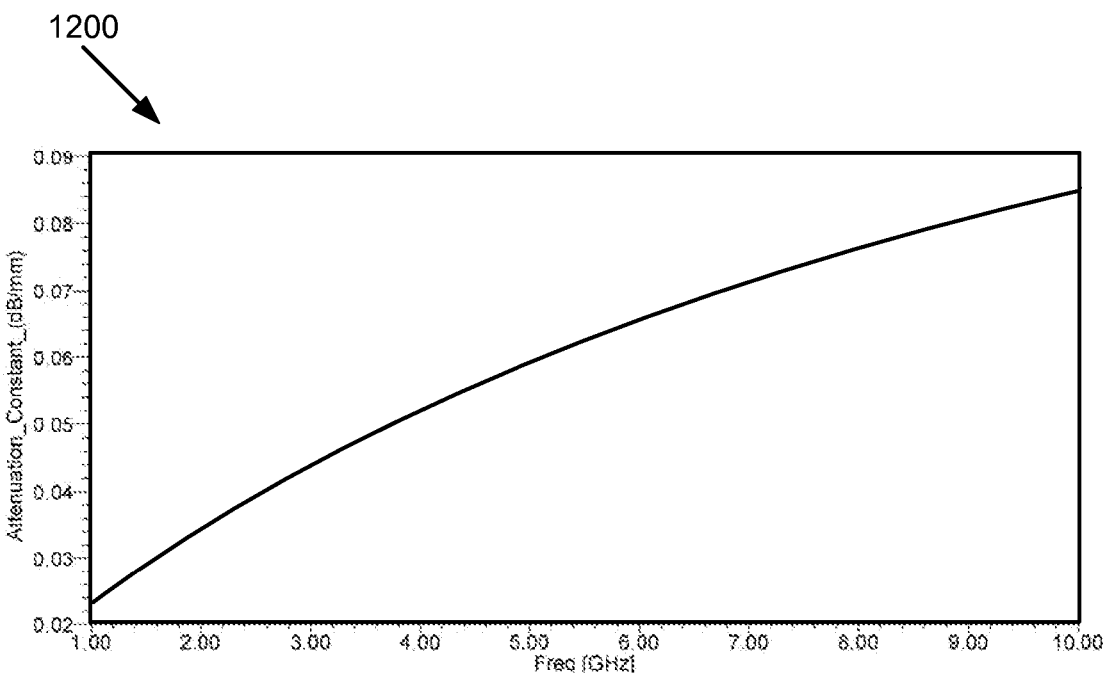
FIG. 12 is a graph illustrating variations in attenuation constant related to electrical signals of particular frequencies transmitted by an electronic device having a dielectric layer.

In contrast, FIG. 12 includes a graph 1200 illustrating changes in attenuation constant for an electronic device having a dielectric layer and an electrically conductive carrier, as described herein, for signals having frequencies from approximately 1 GHz to approximately 10 GHz (for a 50 ohms transmission line). The attenuation constant varies from approximately 0.022 dB/mm to approximately 0.085 dB/mm over these frequencies. In particular, the electronic device associated with the graph 1200 has a maximum attenuation constant of approximately 0.10 dB/mm for electromagnetic signals having frequencies from approximately 5 GHz to approximately 10 GHz. Hence, transmission loss is much lower in the electronic device having the dielectric layer than in the electronic device having the embedded grounding plane.

Figure 13:
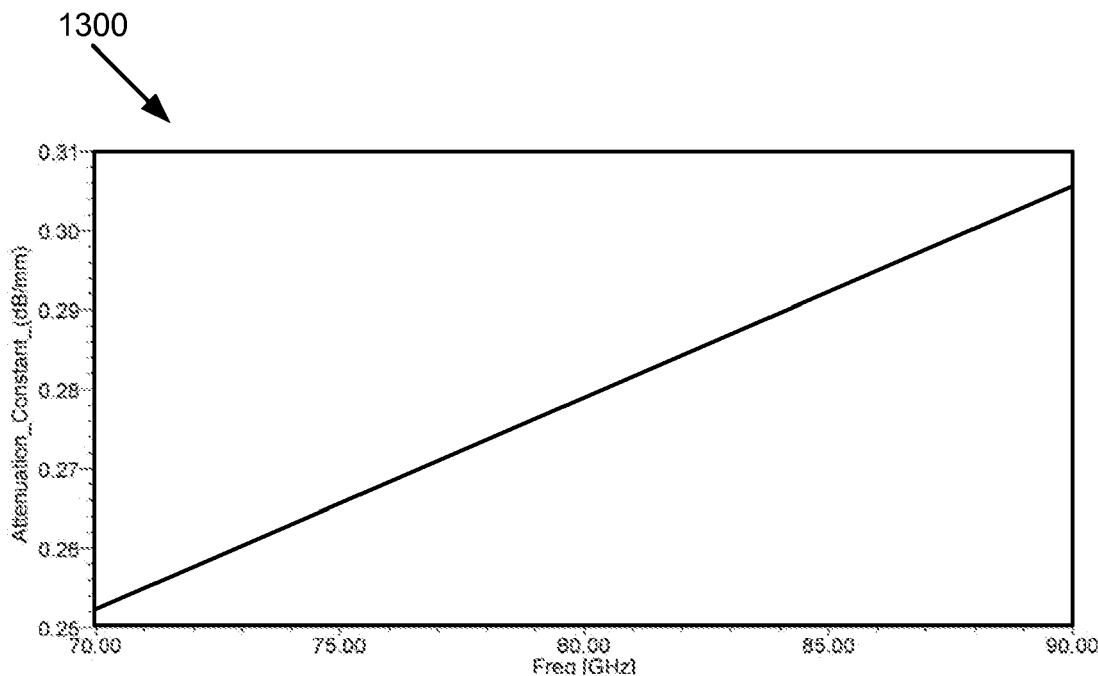
FIG. 13 is a graph illustrating variations in attenuation constant related to electrical signals of other particular frequencies transmitted by an electronic device having an embedded grounding plane.

In another example, the graph 1300 illustrated in FIG. 13 illustrates changes in attenuation constant for a conventional electronic device using an embedded grounding plane, for signals having frequencies from approximately 70 GHz to approximately 90 GHz at approximately 50 ohms. The attenuation constant for this electronic device varies from approximately 0.25 dB/mm to 0.30 dB/mm over these frequencies.

Figure 14:
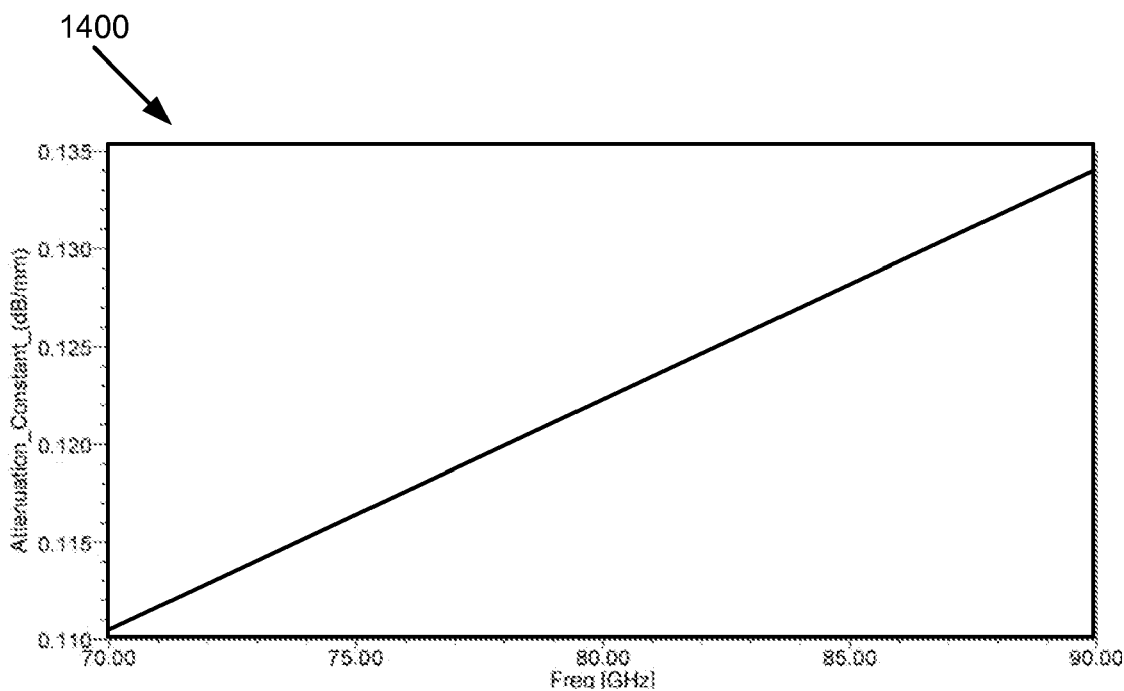
FIG. 14 is a graph illustrating variations in attenuation constant related to electrical signals of other particular frequencies transmitted by an electronic device having a dielectric layer.

In contrast, FIG. 14 includes a graph 1400 illustrating changes in attenuation constant for an electronic device having a dielectric layer and an electrically conductive carrier, as described herein, for signals having frequencies from approximately 70 GHz to approximately 90 GHz (for a 50 ohms transmission line). The attenuation constant varies from approximately 0.11 dB/mm to approximately 0.135 dB/mm over these frequencies. In particular, the electronic device associated with the graph 1400 has a maximum attenuation constant of approximately 0.15 dB/mm for electromagnetic signals having frequencies from approximately 70 GHz to approximately 90 GHz.

Many different aspects and embodiments are possible. Some of those aspects and embodiments are described below. After reading this specification, skilled artisans will appreciate that those aspects and embodiments are only illustrative and do not limit the scope of the present invention.

According to a first aspect, an electronic device can include a first die. The electronic device can also include a dielectric layer defining a first opening. The first die can be disposed within the first opening. Further, the electronic device can include an encapsulating material disposed adjacent to the first die. The encapsulating material can have a different composition as compared to the dielectric layer.

In an embodiment of the first aspect, the electronic device can also include a second die that is disposed within a second opening of the dielectric layer. Moreover, the electronic device can include a first signal line coupled to the first die and the second die. The dielectric layer is disposed between the signal line and the encapsulating material. The electronic device can be operable to transmit a signal having a frequency of up to approximately 100 GHz along the first signal line.

In another embodiment of the first aspect, the electronic device can include a second signal line coupled to the first die. The electronic device can be operable to transmit a signal having a frequency that is up to approximately 100 GHz along the second signal line. In an illustrative embodiment, the first and second signal lines lie at approximately a same elevation.

In a further embodiment of the first aspect, the electronic device can include a via connected to the second signal line. The first signal line is not electrically connected to any via. The via extends to a surface of the encapsulating material that is opposite an active portion of the first die. In one example, the electronic device can include a plurality of vias between the first and second dies. In an illustrative embodiment, some of the plurality of vias can be electrically connected to each other by a conductive layer, where the dielectric layer lies between the conductive layer and the encapsulating material.

In another embodiment of the first aspect, the electronic device includes an additional signal line coupled to the first die. The electronic device is operable to transmit a signal having a frequency that does not exceed approximately 900 MHz along the additional signal line.

In an additional embodiment of the first aspect, the dielectric layer includes an organic material, such as a composite of an organic material and a ceramic material. A dielectric constant of the dielectric layer can be within approximately fifty percent of a dielectric constant of the encapsulating material. For instance, the dielectric constant of the dielectric layer can be within approximately ten percent of a dielectric constant of the encapsulating material.

According to a second aspect, an electronic device can include a plurality of dies. The electronic device can also include a dielectric layer defining a plurality of openings, where each of the plurality of dies is disposed within an opening. Further, the electronic device can include an encapsulating material disposed adjacent to each of the plurality of dies. The encapsulating material can have a different composition as compared to the dielectric layer. A maximum attenuation constant of the electronic device can be approximately 0.15 dB/mm for electromagnetic waves having frequencies in a range of from approximately 70 GHz to approximately 90 GHz.

In another embodiment of the second aspect, the electronic device can include an electrically conductive carrier having a length substantially perpendicular to a plane of the dielectric layer. The electrically conductive carrier contacts both the dielectric layer and the molding layer. The electrically conductive carrier is adapted to electrically ground the electronic device, to at least partially shield a die from electromagnetic interference, or any combination thereof.

In a further embodiment of the second aspect, the dielectric layer can be in a form of a dielectric plate.

According to a third aspect, a method of packaging an electronic device can include providing a patterned dielectric layer, the patterned dielectric layer including a first area sized to receive a first die and a second area sized to receive a second die. The method can also include placing the first die within the first area and the second die within the second area. The method can also include encapsulating the first die and the second die within an encapsulating material. The method can further include forming a first signal line coupled to the first die and the second die. The dielectric layer can be disposed between the signal line and the encapsulating material. The electronic device can be operable to transmit a signal having a frequency of up to approximately 100 GHz along the first signal line. The method can also include forming an additional signal line coupled to the first die or the second die. The electronic device can be operable to transmit a signal having a frequency that does not exceed approximately 900 MHz along the additional signal line.

In an embodiment of the third aspect, the method can include forming a plurality of vias extending through both the dielectric layer and the encapsulating material and filling each of the vias with a conductive material. In another embodiment of the third aspect, the method includes forming a patterned conductive layer contacting the dielectric material. The dielectric material is disposed between the conductive layer and the encapsulating material, and each of the plurality of vias contacts the patterned conductive layer. The plurality of vias can be formed by laser drilling, chemical etching, or any combination thereof.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Many other embodiments may be apparent to those of skill in the art upon reviewing the disclosure. Other embodiments may be used and derived from the disclosure, such that a structural substitution, logical substitution, or another change may be made without departing from the scope of the disclosure. Accordingly, the disclosure is to be regarded as illustrative rather than restrictive.

Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of packaging an electronic device, the method comprising:
   providing a patterned dielectric layer, including a first area sized to receive a first die, and a second area sized to receive a second die;

placing the first die within the first area and the second die within the second area;

encapsulating the first die and the second die within an encapsulating material, wherein the encapsulating material has a different composition as compared to the dielectric layer;

forming a first signal line coupled to the first die and the second die, wherein the dielectric layer is disposed between the signal line and the encapsulating material;

forming a second signal line coupled to the first die, wherein the electronic device is operable to transmit a signal having a frequency within a range of from 1 GHz to 100 GHz along the second signal line; and forming an additional signal line coupled to the first die, wherein the electronic device is operable to transmit a signal having a frequency that does not exceed 900 MHz along the additional signal line.

2. The method of claim 1, wherein the electronic device is operable to transmit a signal having a frequency within a range of from 1 GHz to 100 GHz along the first signal line.

3. The method of claim 1, further comprising forming a thru via that extends through the dielectric layer and the encapsulating material, wherein the first die is coupled to the thru via.

4. The method of claim 1, further comprising forming a plurality of vias between the first die and the second die.

5. The method of claim 4, further comprising connecting a first via of the plurality of vias and a second via of the plurality of vias to each other by a conductive layer, wherein the dielectric layer lies between the conductive layer and the encapsulating material.

6. The method of claim 4, further comprising:
forming a patterned conductive layer, wherein the dielectric material is disposed between the conductive layer and the encapsulating material; and
wherein each of the plurality of vias is electrically connected with the conductive layer.

7. The method of claim 4, wherein the plurality of vias are formed by laser drilling, chemical etching, or any combination thereof.

8. The method of claim 4, further comprising filling the plurality of vias with a conductive material.

9. The method of claim 1, wherein the second signal line is formed at approximately a same elevation as the first signal line.

10. The method of claim 1, wherein the dielectric layer includes an organic material.

11. The method of claim 10, wherein the dielectric layer comprises a composite of the organic material and a ceramic material.

12. The method of claim 10, wherein a dielectric constant of the dielectric layer is within fifty percent of a dielectric constant of the encapsulating material.

13. The method of claim 12, wherein the dielectric constant of the dielectric layer is within ten percent of the dielectric constant of the encapsulating material.

14. A method of packaging an electronic device, the method comprising:
providing a patterned dielectric layer, including a first open area, and a second open area;
placing a first die within the first open area and a second die within the second open area; and
encapsulating the first die and the second die within an encapsulating material, wherein the encapsulating material has a different composition as compared to the dielectric layer;
wherein a maximum attenuation constant of the electronic device is 0.15 dB/mm for electromagnetic signals having frequencies in a range of from 70 GHz to 90 GHz.

15. The method of claim 14, wherein the dielectric layer is in a form of a dielectric plate.

16. The method of claim 14, further comprising forming an electrically conductive carrier having a length substantially perpendicular to a width of the dielectric layer, the electrically conductive carrier contacting both the dielectric layer and the encapsulating material.

17. The method of claim 16, wherein the electrically conductive carrier is adapted to electrically ground the electronic device and to shield the first die from electromagnetic interference.

18. The method of claim 17, wherein the electrically conductive carrier is formed as a thru via.

19. The method of claim 18, wherein the first die is coupled to the thru via.

20. A method of providing a signal line for an electronic device, the method comprising:
providing a patterned dielectric layer, including a first open area and a second open area;
placing a first die within the first open area and a second die within the second open area;
encapsulating a first non-active portion of the first die and a second non-active portion of the second die within an encapsulating material, wherein the encapsulating material has a different composition as compared to the dielectric layer;
forming the signal line such that the dielectric layer is disposed between the signal line and the encapsulating material, wherein the signal line is coupled to the first die and the second die, and the signal line is operable to transmit a signal having a frequency within a range of from 1 GHz to 100 GHz.

* * * * *